(12) United States Patent
Tsutsui et al.

(10) Patent No.: US 9,991,859 B2
(45) Date of Patent: Jun. 5, 2018

(54) POWER AMPLIFICATION MODULE

(71) Applicant: Murata Manufacturing Co., Ltd., Kyoto (JP)

(72) Inventors: Takayuki Tsutsui, Kyoto (JP); Fumio Harima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days. days.

(21) Appl. No.: 15/709,787

(22) Filed: Sep. 20, 2017

(65) Prior Publication Data

US 2018/0083583 A1    Mar. 22, 2018

(30) Foreign Application Priority Data

Sep. 21, 2016    (JP) ................ 2016-184165

(51) Int. Cl.
*H03F 3/72* (2006.01)
*H03F 1/56* (2006.01)
*H03F 3/21* (2006.01)
*H03F 3/195* (2006.01)
*H03F 3/24* (2006.01)
*H04B 1/40* (2015.01)

(52) U.S. Cl.
CPC ............. *H03F 3/72* (2013.01); *H03F 1/56* (2013.01); *H03F 3/195* (2013.01); *H03F 3/211* (2013.01); *H03F 3/245* (2013.01); *H03F 2200/222* (2013.01); *H03F 2200/387* (2013.01); *H03F 2200/451* (2013.01); *H03F 2203/7236* (2013.01); *H04B 1/40* (2013.01)

(58) Field of Classification Search
CPC ....................................... H03F 3/72
See application file for complete search history.

(56) References Cited

U.S. PATENT DOCUMENTS

| 2007/0018758 A1 | 1/2007 | Fukuda et al. |
| 2010/0291888 A1 | 11/2010 | Hadjichristos et al. |
| 2016/0190995 A1 | 6/2016 | Penticoff |

FOREIGN PATENT DOCUMENTS

| JP | 2015-156687 A | 8/2015 |
| JP | 2016-042699 A | 3/2016 |
| WO | 2004082138 A1 | 9/2004 |
| WO | 2014013869 A1 | 1/2014 |

*Primary Examiner* — Patricia T Nguyen
(74) *Attorney, Agent, or Firm* — Pearne & Gordon LLP (57) ABSTRACT

Provided is a power amplification module that supports a plurality of communication systems. The power amplification module includes: two power amplifiers that can be selectively connected in parallel with each other; a switch that, in accordance with one communication system selected from among the plurality of communication systems, selects one power amplifier that is to operate by itself from among the two power amplifiers or selects the two power amplifiers and connects the two power amplifiers in parallel with each other; and a phase correction circuit that, when the two power amplifiers are both selected, corrects a phase difference by being selectively connected between the outputs of the two selected power amplifiers such that a phase difference is not generated between the output signals of the two selected power amplifiers.

12 Claims, 4 Drawing Sheets

POWER AMPLIFICATION MODULE

This application claims priority from Japanese Patent Application No. 2016-184165 filed on Sep. 21, 2016. The content of this application is incorporated herein by reference in its entirety.

BACKGROUND

The present disclosure relates to a power amplification module. There is a demand for mobile communication terminals such as cellular phones to be able to support a plurality of communication systems (multi-mode) and a plurality of frequency bands (multi-band) as a single terminal. Examples of such communication systems include the global system for mobile communications (GSM) (registered trademark), enhanced data rates for GSM evolution (EDGE), universal mobile telecommunications system (UMTS), wideband code division multiple access (W-CDMA), and long term evolution (LTE). The frequency bands are defined by telecommunications standards in the respective communication systems. For example, only a 2 GHz band was initially used as a frequency band in the third generation mobile communication system, but an 800 MHz band and a 1.7 GHz band were later added due to the rapid increase in the number of users. Taking convenience when overseas into consideration, it is desirable for mobile communication terminals to support an even greater number of communication systems and frequency bands. In light of these circumstances, a power amplification module for use in a multi-mode multi-band mobile communication terminal is proposed in Japanese Unexamined Patent Application Publication No. 2015-156687. The power amplification module includes a plurality of power amplifiers and a plurality of switches used to select a combination of power amplifiers that will operate in parallel in accordance with one communication system selected from among a plurality of communication systems and in accordance with the transmission power.

However, when a plurality of power amplifiers are made to operate by being connected in parallel with each other, a phase difference (phase advancement or phase retardation) may be generated between output signals of the plurality of power amplifiers due to external environmental factors such as variations between circuits operating in parallel, temperature changes, load variations and so on, and consequently oscillations may occur.

BRIEF SUMMARY

Accordingly, the present disclosure suppresses oscillations caused by a phase difference between output signals of power amplifiers operating in parallel.

A power amplification module according to an embodiment of the present disclosure supports a plurality of communication systems. The power amplification module includes: (i) two power amplifiers that can be selectively connected in parallel with each other; (ii) a switch that, in accordance with one communication system selected from among the plurality of communication systems, selects one power amplifier that is to operate by itself from among the two power amplifiers or selects the two power amplifiers and connects the two power amplifiers in parallel with each other; and (iii) a phase correction circuit that, when the two power amplifiers are selected, corrects a phase difference by being selectively connected between outputs of the two selected power amplifiers such that a phase difference is not generated between output signals of the two selected power amplifiers.

According to the embodiment of the present disclosure, oscillations caused by a phase difference between output signals of power amplifiers that operating in parallel with each other can be suppressed.

Other features, characteristics, elements and advantages of the present disclosure will become more apparent from the following detailed description of embodiments of the present disclosure with reference to the attached drawings.

DETAILED DESCRIPTION

Figure 1:
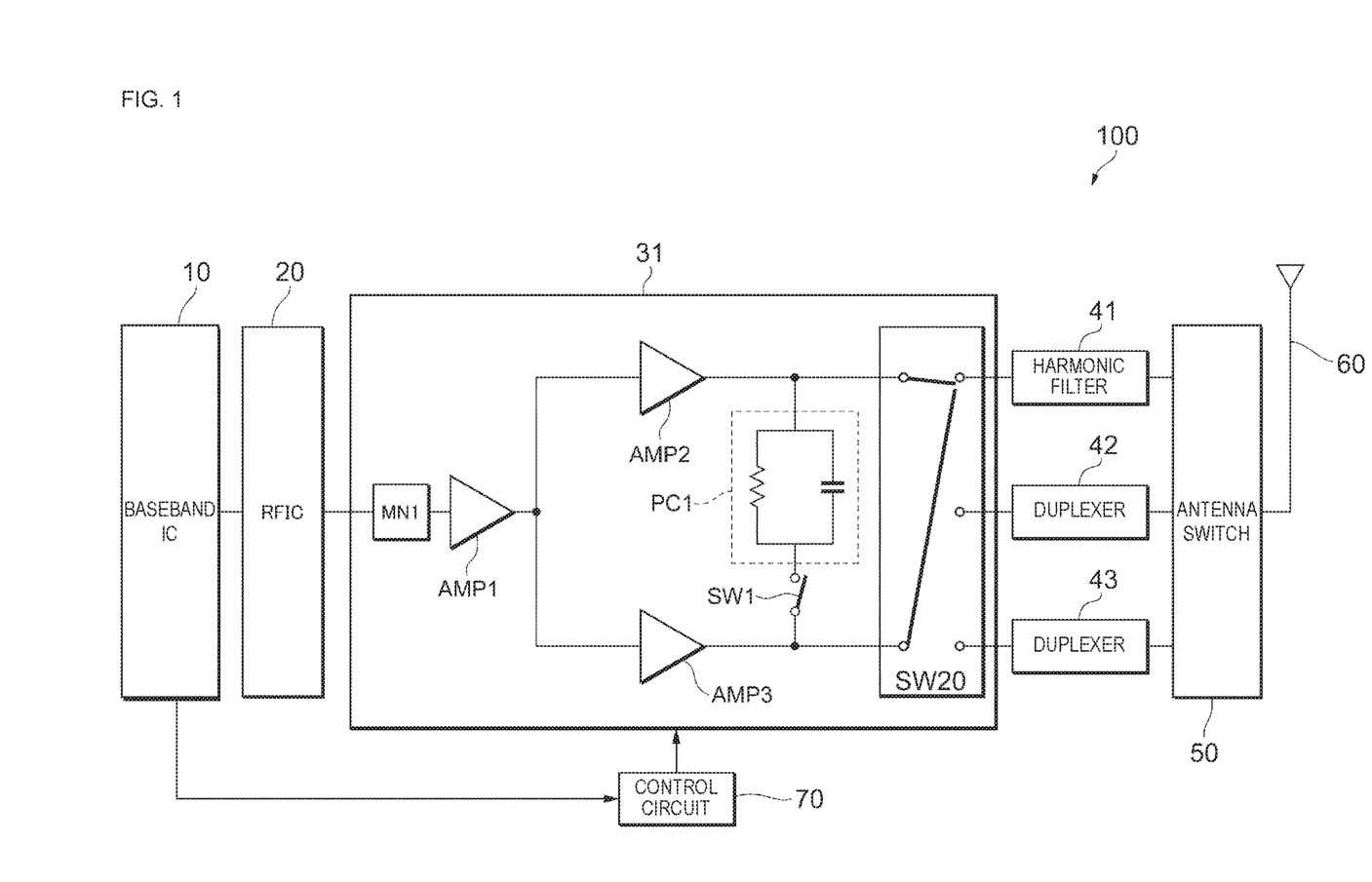
FIG. 1 is an explanatory diagram illustrating the fundamental circuit configuration of a communication module according to embodiment 1 of the present disclosure.

Hereafter, embodiments of the present disclosure will be described while referring the drawings. Here, circuit elements that are the same as each other will be denoted by the same symbols and repeated description thereof is omitted. FIG. 1 is an explanatory diagram illustrating the fundamental circuit configuration of a communication module 100 according to embodiment 1 of the present disclosure. The communication module 100 is a module that is included in a mobile communication terminal such as a cellular phone. The communication module 100 is for transmitting and receiving radio frequency (RF) signals to and from a base station, and supports multiple modes and multiple bands. Here, a case will be exemplified in which the communication module 100 supports GSM (registered trademark), EDGE and LTE, but the communication systems supported by the communication module 100 are not especially limited. In addition, for convenience of explanation, circuit elements related to processing of a transmission signal are mainly illustrated, and illustration of circuit elements related to a reception signal is omitted.

The communication module 100 includes a baseband integrated circuit (IC) 10, a radio frequency integrated circuit (RFIC) 20, a power amplification module 31, a harmonic filter 41, duplexers 42 and 43, an antenna switch 50, an antenna 60, and a control circuit 70. The control circuit 70 may be built into the inside of the power amplification module 31 or the inside of a chip.

The baseband IC 10 generates baseband signals for the respective communication systems by performing digital signal processing. The RFIC 20 generates a transmission signal by modulating a carrier wave in accordance with information superposed on a baseband signal. The transmission signal is an RF signal that has a different frequency band depending on the communication system used.

The power amplification module 31 is a module for amplifying the power of a transmission signal. The power amplification module 31 includes power amplifiers AMP1, AMP2 and AMP3, a phase correction circuit PC1, a matching network MN1, a switch SW20 (first switch) and a switch SW1 (second switch). The power amplifier AMP1 functions as a driver-stage power amplifier that is connected upstream of the two power amplifiers AMP2 and AMP3. The two power amplifiers AMP2 and AMP3 function as output-stage power amplifiers. The outputs of the two power amplifiers AMP2 and AMP3 can be selectively connected in parallel with each other via the phase correction circuit PC1 through an opening/closing operation of the switch SW1. The phase correction circuit PC1 has a circuit configuration in which a resistor element and a capacitor element are connected in parallel with each other, for example. The switch SW1 selectively connects the phase correction circuit PC1 between the outputs of the two selected power amplifiers AMP2 and AMP3.

The control circuit 70 receives mode information indicating one communication system selected from among the plurality of communication systems from the baseband IC 10 or the RFIC 20. The control circuit 70 outputs a control signal to the switch SW20 in response to the received mode information. The control signal instructs the switch SW20 to select one power amplifier that is to operate by itself from among the two power amplifiers AMP2 and AMP3 and connect the one power amplifier to a predetermined connection target. Alternatively, the control signal instructs the switch SW20 to select the two power amplifiers AMP2 and AMP3 and commonly connect the two power amplifiers AMP2 and AMP3 to a predetermined connection target. Here, "predetermined connection target" refers to any one of the harmonic filter 41, the duplexer 42 and the duplexer 43 stipulated in the respective communication systems. The switch SW20 selects one power amplifier that is to operate by itself from among the two power amplifiers AMP2 and AMP3 and connects the selected power amplifier to the predetermined connection target in response to the control signal from the control circuit 70. Alternatively, the switch SW20 selects the two power amplifiers AMP2 and AMP3 and commonly connects the two power amplifiers AMP2 and AMP3 to the predetermined connection target in response to the control signal from the control circuit 70.

The control circuit 70 outputs a control signal to the switch SW1 that instructs the switch SW1 to close when the control circuit 70 makes the two power amplifiers AMP2 and AMP3 operate in parallel with each other. The switch SW1 connects the phase correction circuit PC1 between the outputs of the two power amplifiers AMP2 and AMP3 by closing in response to the control signal from the control circuit 70. The control circuit 70 outputs a control signal to the switch SW1 that instructs the switch SW1 to open when control circuit 70 makes either one of the two power amplifiers AMP2 and AMP3 operate by itself. The switch SW1 severs the connection established via the phase correction circuit PC1 between the outputs of the two power amplifiers AMP2 and AMP3 by opening in response to the control signal from the control circuit 70.

Next, a specific operation will be described for the case where the mode information indicating the communication system of the transmission signal is GSM (registered trademark) or EDGE, for example, that is, the case where the mode information indicates a communication system in which a high output is required. In this case, the control circuit 70 outputs a control signal to the switch SW20 that instructs the switch SW20 to select and commonly connect the two power amplifiers AMP2 and AMP3 to the harmonic filter 41, which is stipulated in advance. In addition, the control circuit 70 outputs a control signal to the switch SW1 that instructs the switch SW1 to connect the phase correction circuit PC1 between the outputs of the two power amplifiers AMP2 and AMP3. Thus, in the GSM (registered trademark) or EDGE communication system, a transmission signal from the RFIC 20 is amplified by the two parallel-connected power amplifiers AMP2 and AMP3 in addition to the power amplifier AMP1, and is then guided to the harmonic filter 41. The transmission signal is guided to the antenna 60 from the harmonic filter 41 via the antenna switch 50, and is then transmitted from the antenna 60. In this case, even when a phase difference is generated between the output signals of the two power amplifiers AMP2 and AMP3 due to factors such as changes in temperature and variations in load, the phase difference is made to converge to zero by the phase correction circuit PC1, and therefore, oscillations can be suppressed.

Next, a specific operation will be described for the case in which the mode information indicating the communication system of the transmission signal is LTE very low band, for example, that is, the case where the mode information indicates a communication system that operates sufficiently at a lower output than GSM (registered trademark) or EDGE. The control circuit 70 outputs a control signal to the switch SW20 that instructs the switch SW20 to select the one power amplifier AMP2 from among the two power amplifiers AMP2 and AMP3 and connect the selected one power amplifier AMP2 to the duplexer 42, which is stipulated in advance. In addition, the control circuit 70 outputs a control signal to the switch SW1 that instructs the switch SW1 to sever the connection established between the outputs of the two power amplifiers AMP2 and AMP3 via the phase correction circuit PC1. Thus, in the LTE very-low-band communication system, a transmission signal from the RFIC 20 is amplified by the power amplifier AMP2 in addition to the power amplifier AMP1, and is then guided to the duplexer 42. The transmission signal is guided to the antenna 60 from the duplexer 42 via the antenna switch 50, and is then transmitted from the antenna 60. The very low band is a 700 MHz band, for example.

Next, a specific operation will be described for the case in which the mode information indicating the communication system of the transmission signal is LTE low band, for example, that is, the case where the mode information indicates a communication system that operates sufficiently at a lower output than GSM (registered trademark) or EDGE. The control circuit 70 outputs a control signal to the switch SW20 that instructs the switch SW20 to select the one power amplifier AMP3 from among the two power amplifiers AMP2 and AMP3 and connect the selected one power amplifier AMP3 to the duplexer 43, which is stipulated in advance. In addition, the control circuit 70 outputs a control signal to the switch SW1 that instructs the switch SW1 to sever the connection established between the outputs of the two power amplifiers AMP2 and AMP3 via the phase correction circuit PC1. Thus, in the LTE low-band communication system, a transmission signal from the RFIC 20 is amplified by the power amplifier AMP3 in addition to the power amplifier AMP1, and is then guided to the duplexer 43. The transmission signal is guided to the antenna 60 from the duplexer 43 via the antenna switch 50, and is then transmitted from the antenna 60. The low band is an 800 MHz band or a 900 MHz band, for example.

The circuits can be designed in advance such that the power amplifiers AMP2 and AMP3 are able to amplify a GSM (registered trademark) or EDGE transmission signal under optimal conditions by operating in parallel. Furthermore, the circuits can be designed in advance such that the power amplifiers AMP2 and AMP3 are each able to amplify an LTE very low band or LTE low band transmission signal under optimal conditions by operating by themselves. The characteristics of the power amplifiers AMP2 and AMP3 do not necessarily have to be the same. In addition, although GSM (registered trademark) and EDGE have been exemplified as communication systems that require high output, a carrier aggregation system such as HP-UE may instead be adopted as a communication system that requires high output, for example.

As described above, according to embodiment 1, in the case where the two power amplifiers AMP2 and AMP3 are both selected, phase difference correction is performed by the phase correction circuit PC1 such that no phase difference is generated between the output signals of the two power amplifiers AMP2 and AMP3. Thus, even when a phase difference is generated between the output signals of the two power amplifiers AMP2 and AMP3 due to factors such as changes in temperature or variations in load, the phase difference is made to converge to zero by the phase correction circuit PC1, and therefore, oscillations can be suppressed.

Figure 2:
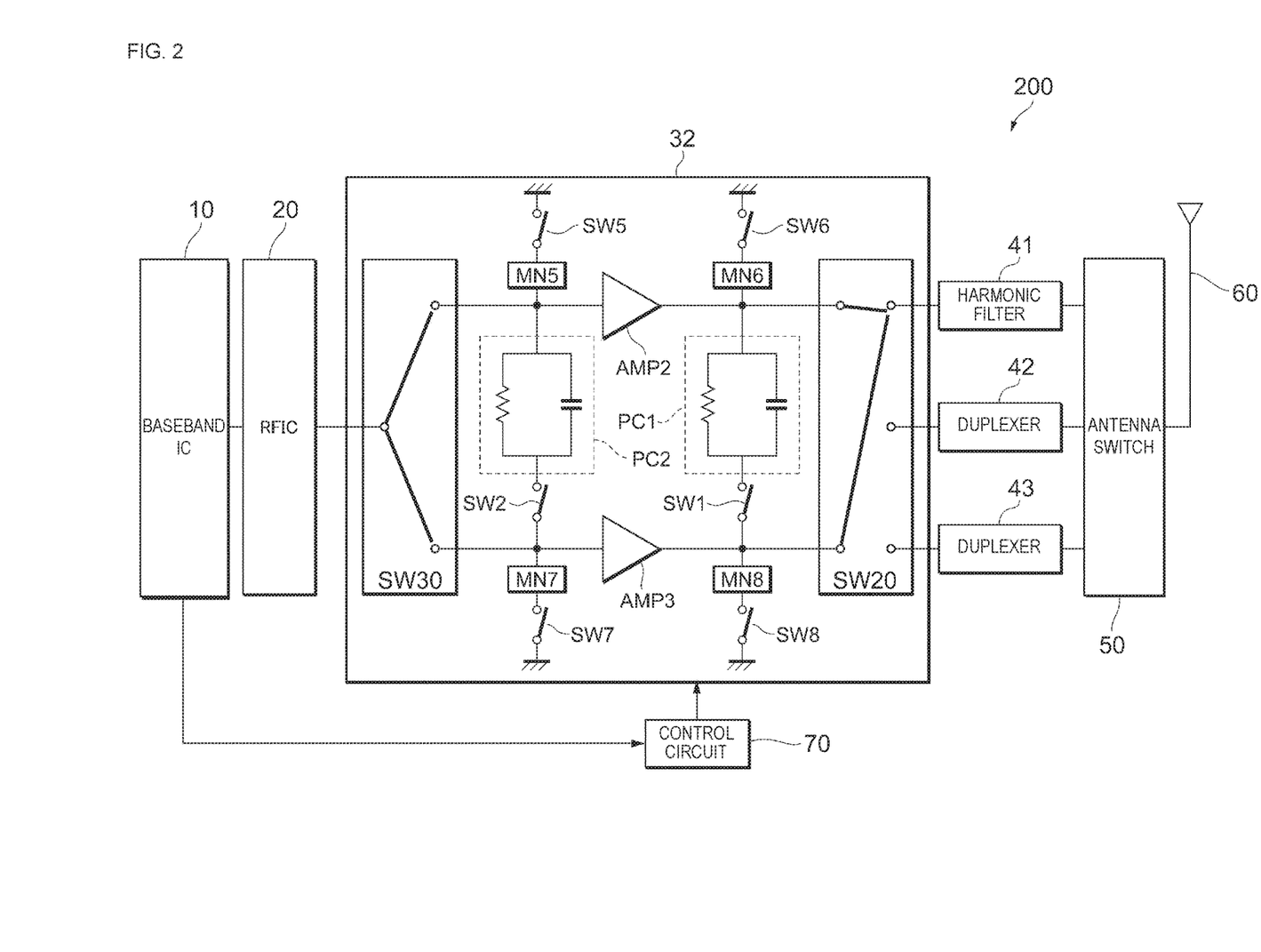
FIG. 2 is an explanatory diagram illustrating the fundamental circuit configuration of a communication module according to embodiment 2 of the present disclosure.

FIG. 2 is an explanatory diagram illustrating the fundamental circuit configuration of a communication module 200 according to embodiment 2 of the present disclosure. Symbols that are the same as those in FIG. 1 denote the same circuit elements as in FIG. 1, and therefore the description will focus on the differences between embodiments 1 and 2. A power amplification module 32 of embodiment 2 differs from the power amplification module 31 of embodiment 1 in that the power amplification module 32 includes a plurality of matching networks MN5, MN6, MN7 and MN8. In addition, the power amplification module 32 may include a plurality of power amplifiers.

The communication module 200 includes a baseband IC 10, an RFIC 20, the power amplification module 32, a harmonic filter 41, duplexers 42 and 43, an antenna switch 50, an antenna 60, and a control circuit 70. The power amplification module 32 includes power amplifiers AMP2 and AMP3, phase correction circuits PC1 and PC2, matching networks MN5, MN6, MN7 and MN8, a switch SW20 (first switch), a switch SW30 (first switch), a switch SW1 (second switch), a switch SW2 (fourth switch), a switch SW5 (third switch), a switch SW6 (third switch), a switch SW7 (third switch) and a switch SW8 (third switch).

The inputs of the two power amplifiers AMP2 and AMP3 can be selectively connected in parallel with each other via the phase correction circuit PC2 through an opening/closing operation of the switch SW2. The phase correction circuit PC2 has a circuit configuration in which a resistor element and a capacitor element are connected in parallel with each other, for example. The switch SW2 selectively connects the phase correction circuit PC2 between the inputs of the two selected power amplifiers AMP2 and AMP3.

The matching network MN5 performs input impedance matching for the power amplifier AMP2 by being selectively connected to the input of the power amplifier AMP2 through an opening/closing operation of the switch SW5. The matching network MN6 performs output impedance matching for the power amplifier AMP2 by being selectively connected to the output of the power amplifier AMP2 through an opening/closing operation of the switch SW6. The matching network MN7 performs input impedance matching for the power amplifier AMP3 by being selectively connected to the input of the power amplifier AMP3 through an opening/closing operation of the switch SW7. The matching network MN8 performs output impedance matching for the power amplifier AMP3 by being selectively connected to the output of the power amplifier AMP3 through an opening/closing operation of the switch SW8. The matching networks MN5, MN6, MN7 and MN8 are each formed of a capacitor element, an inductor element or a combination of capacitor elements and inductor elements.

Next, a specific operation will be described for the case where the mode information indicating the communication system of the transmission signal is GSM (registered trademark) or EDGE, for example, that is, the case where the mode information indicates a communication system in which a high output is required. In this case, the control circuit 70 outputs control signals to the switches SW20 and SW30 that instruct the switches SW20 and SW30 to select and commonly connect the two power amplifiers AMP2 and AMP3 to the harmonic filter 41, which is stipulated in advance. In addition, the control circuit 70 outputs a control signal to the switch SW1 that instructs the switch SW1 to connect the phase correction circuit PC1 between the outputs of the two power amplifiers AMP2 and AMP3. In addition, the control circuit 70 outputs a control signal to the switch SW2 that instructs the switch SW2 to connect the phase correction circuit PC2 between the inputs of the two power amplifiers AMP2 and AMP3. In addition, the control circuit 70 outputs control signals to the switches SW5, SW6, SW7 and SW8 that instruct the switches SW5, SW6, SW7 and SW8 to close, for example. Thus, in the GSM (registered trademark) or EDGE communication system, a transmission signal from the RFIC 20 is amplified by the two parallel-connected power amplifiers AMP2 and AMP3, and is then guided to the harmonic filter 41. Next, the transmission signal is guided to the antenna 60 from the harmonic filter 41 via the antenna switch 50, and is then transmitted from the antenna 60. At this time, even when a phase difference is generated between the output signals of the two power amplifiers AMP2 and AMP3 due factors such as changes in temperature and variations in load, the phase difference is made to converge to zero by the phase correction circuits PC1 and PC2, and therefore, oscillations can be suppressed. In addition, input impedance matching and output impedance matching are performed for the two power amplifiers AMP2 and AMP3 by the plurality of matching networks MN5, MN6, MN7 and MN8, and therefore mismatching loss can be suppressed.

Next, a specific operation will be described for the case in which the mode information indicating the communication system of the transmission signal is LTE very low band, for example, that is, the case where the mode information indicates a communication system that operates sufficiently at a lower output than GSM (registered trademark) or EDGE. The control circuit 70 outputs control signals to the switches SW20 and SW30 that instruct the switches SW20 and SW30 to select one power amplifier AMP2 from among the two power amplifiers AMP2 and AMP3 and connect the one selected power amplifier AMP2 to the duplexer 42, which is stipulated in advance. In addition, the control circuit 70 outputs a control signal to the switch SW1 that instructs the switch SW1 to sever the connection established between the outputs of the two power amplifiers AMP2 and AMP3 via the phase correction circuit PC1. Similarly, the control circuit 70 outputs a control signal to the switch SW2 that instructs the switch SW2 to sever the connection established via the phase correction circuit PC2 between the inputs of the two power amplifiers AMP2 and AMP3. In addition, the control circuit 70 outputs control signals to the switches SW7 and SW8 that instruct the switches SW7 and SW8 to open while outputting control signals to the switches SW5 and SW6 that instruct the switches SW5 and SW6 to close, for example. Thus, in the LTE very low band communication system, a transmission signal from the RFIC 20 is amplified by the power amplifier AMP2 and is then guided to the duplexer 42. Next, the transmission signal is guided to the antenna 60 from the duplexer 42 via the antenna switch 50, and is then transmitted from the antenna 60. At this time, input impedance matching and output impedance matching are performed for the power amplifier AMP2 by the plurality of matching networks MN5 and MN6, and therefore mismatching loss can be suppressed.

Next, a specific operation will be described for the case in which the mode information indicating the communication system of the transmission signal is LTE low band, for example, that is, the case where the mode information indicates a communication system that operates sufficiently at a lower output than GSM (registered trademark) or EDGE. The control circuit 70 outputs control signals to the switches SW20 and SW30 that instruct the switches SW20 and SW30 to select one power amplifier AMP3 from among the two power amplifiers AMP2 and AMP3 and connect the selected one power amplifier AMP3 to the duplexer 43, which is stipulated in advance. In addition, the control circuit 70 outputs a control signal to the switch SW1 that instructs the switch SW1 to sever the connection established between the outputs of the two power amplifiers AMP2 and AMP3 via the phase correction circuit PC1. Similarly, the control circuit 70 outputs a control signal to the switch SW2 that instructs the switch SW2 to sever the connection established via the phase correction circuit PC2 between the inputs of the two power amplifiers AMP2 and AMP3. In addition, the control circuit 70 outputs control signals to the switches SW5 and SW6 that instruct the switches SW5 and SW6 to open while outputting control signals to the switches SW7 and SW8 that instruct the switches SW7 and SW8 to close, for example. Thus, in the LTE low band communication system, a transmission signal from the RFIC 20 is amplified by the power amplifier AMP3, and is then guided to the duplexer 43. Next, the transmission signal is guided to the antenna 60 from the duplexer 43 via the antenna switch 50, and is then transmitted from the antenna 60. At this time, input impedance matching and output impedance matching are performed for the power amplifier AMP3 by the plurality of matching networks MN7 and MN8, and therefore mismatching loss can be suppressed.

As described above, the power amplification module 32 of embodiment 2 includes the switches SW5 and SW7 that respectively selectively connect the matching networks MN5 and MN7 to the inputs of the one or two selected power amplifiers AMP2 and AMP3. Similarly, the power amplification module 32 includes the switches SW6 and SW8 that respectively selectively connect the matching networks MN6 and MN8 to the outputs of the one or two selected power amplifiers AMP2 and AMP3. Thus, the combination of the open/closed states of the switches SW5, SW6, SW7 and SW8 can be selected (or changed) in accordance with the power amplifiers that are selected. Thus, input impedance matching and output impedance matching are selectively performed for the inputs and outputs of the one or two selected power amplifiers AMP2 and AMP3, and therefore mismatching loss can be reduced.

Figure 3:
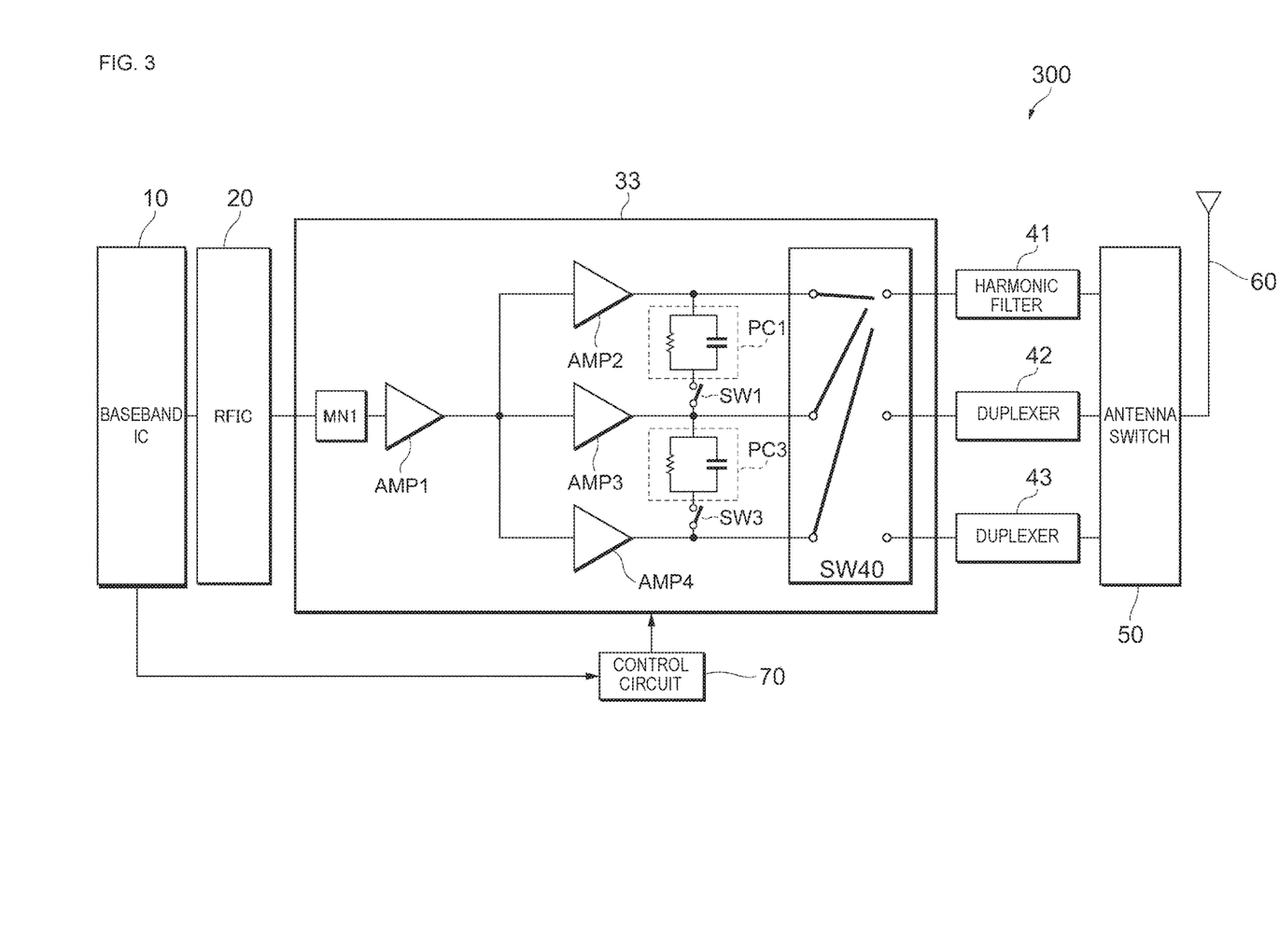
FIG. 3 is an explanatory diagram illustrating the fundamental circuit configuration of a communication module according to embodiment 3 of the present disclosure.

FIG. 3 is an explanatory diagram illustrating the fundamental circuit configuration of a communication module 300 according to embodiment 3 of the present disclosure. Symbols that are the same as those in FIG. 1 denote the same circuit elements as in FIG. 1, and therefore the description will focus on the differences between embodiments 1 and 3.

A power amplification module 33 of embodiment 3 differs from the power amplification module 31 of embodiment 1 in that the power amplification module 33 includes three power amplifiers AMP2, AMP3 and AMP4 that can be selectively connected in parallel with each other.

The communication module 300 includes a baseband IC 10, an RFIC 20, the power amplification module 33, a harmonic filter 41, duplexers 42 and 43, an antenna switch 50, an antenna 60, and a control circuit 70. The power amplification module 33 includes power amplifiers AMP1, AMP2, AMP3 and AMP4, phase correction circuits PC1 and PC3, a matching network MN1, a switch SW40 (first switch), a switch SW1 (second switch) and a switch SW3 (second switch).

The control circuit 70 outputs a control signal to the switch SW40 in accordance with one communication system selected from among a plurality of communication systems and in accordance with the transmission power. The control signal instructs the switch SW40 to select one power amplifier that is to operate by itself from among the three power amplifiers AMP2, AMP3 and AMP4 and to connect the selected one power amplifier to a predetermined connection target. Alternatively, the control signal instructs the switch SW40 to select two or more power amplifiers that are to operate in parallel with each other from among the three power amplifiers AMP2, AMP3 and AMP4 and commonly connect the selected two or more power amplifiers to a predetermined connection target. The switch SW40 selects the one power amplifier that is to operate by itself from among the three power amplifiers AMP2, AMP3 and AMP4 and connects the selected power amplifier to the predetermined connection target in response to a control signal from the control circuit 70. Alternatively, the switch SW40 selects the two or more power amplifiers that are to operate in parallel with each other from among the three power amplifiers AMP2, AMP3 and AMP4 and commonly connects the selected two or more power amplifiers to the predetermined connection target in response to a control signal from the control circuit 70. Here, "predetermined connection target" refers to any one of the harmonic filter 41, the duplexer 42 and the duplexer 43 stipulated by the respective communication systems and transmission outputs.

The control circuit 70 outputs control signals to the switches SW1 and SW3 that instruct the switches SW1 and SW3 to close when control circuit 70 makes the three power amplifiers AMP2, AMP3 and AMP4 operate in parallel with each other. The switch SW1 connects the phase correction circuit PC1 between the outputs of the two power amplifiers AMP2 and AMP3 by closing in response to the control signal from the control circuit 70. The switch SW1 selectively connects the phase correction circuit PC1 between the outputs of the two selected power amplifiers AMP2 and AMP3. Similarly, the switch SW3 connects the phase correction circuit PC3 between the outputs of the two power amplifiers AMP3 and AMP4 by closing in response to the control signal from the control circuit 70. The switch SW3 selectively connects the phase correction circuit PC3 between the outputs of the two selected power amplifiers AMP3 and AMP4.

The control circuit 70 outputs a control signal to the switch SW1 that instructs the switch SW1 to close when control circuit 70 makes the two power amplifiers AMP2 and AMP3 from among the three power amplifiers AMP2, AMP3 and AMP4 operate in parallel with each other. At this time, the control circuit 70 outputs a control signal to the switch SW3 that instructs the switch SW3 to open. The switch SW1 connects the phase correction circuit PC1 between the outputs of the two power amplifiers AMP2 and AMP3 by closing in response to the control signal from the control circuit 70. Similarly, the switch SW3 severs the connection established via the phase correction circuit PC3 between the outputs of the two power amplifiers AMP3 and AMP4 by opening in response to the control signal from the control circuit 70.

The control circuit 70 outputs control signals to the switches SW1 and SW3 that instruct the switches SW1 and SW3 to open when the control circuit 70 makes any one of the three power amplifiers AMP2, AMP3 and AMP4 operate by itself. The switch SW1 severs the connection established via the phase correction circuit PC1 between the outputs of the two power amplifiers AMP2 and AMP3 by opening in response to the control signal from the control circuit 70. Similarly, the switch SW3 severs the connection established via the phase correction circuit PC3 between the outputs of the two power amplifiers AMP3 and AMP4 by opening in response to the control signal from the control circuit 70.

Next, a specific operation will be described for the case where the mode information indicating the communication system of the transmission signal is GSM (registered trademark) or EDGE, for example, and in which the transmission output is equal to or higher than a prescribed threshold. In this case, all three power amplifiers AMP2, AMP3 and AMP4 are selected and connected to the harmonic filter 41 by the switch SW40 in accordance with an instruction from the control circuit 70. Thus, a transmission signal from the RFIC 20 is amplified by the three parallel-connected power amplifiers AMP2, AMP3 and AMP4 in addition to the power amplifier AMP1, and is then guided to the harmonic filter 41. The transmission signal is guided to the antenna 60 from the harmonic filter 41 via the antenna switch 50, and is then transmitted from the antenna 60. At this time, even when a phase difference is generated between the output signals of the three power amplifiers AMP2, AMP3 and AMP4 due to factors such as changes in temperature and variations in load, the phase difference is made to converge to zero by the phase correction circuits PC1 and PC3, and therefore oscillations can be suppressed.

Next, a specific operation will be described for the case where the mode information indicating the communication system of the transmission signal is GSM (registered trademark) or EDGE, for example, and in which the transmission output is less than the prescribed threshold. In this case, the two power amplifiers AMP2 and AMP3 are selected from among the three power amplifiers AMP2, AMP3 and AMP4 and connected to the harmonic filter 41 by the switch SW40 in accordance with an instruction from the control circuit 70. Thus, a transmission signal from the RFIC 20 is amplified by the two parallel-connected power amplifiers AMP2 and AMP3 in addition to the power amplifier AMP1, and is then guided to the harmonic filter 41. The transmission signal is guided to the antenna 60 from the harmonic filter 41 via the antenna switch 50, and is then transmitted from the antenna 60. At this time, even when a phase difference is generated between the output signals of the two power amplifiers AMP2 and AMP3 due to factors such as changes in temperature and variations in load, the phase difference is made to converge to zero by the phase correction circuit PC1, and therefore, oscillations can be suppressed.

Next, a specific operation will be described for the case in which the mode information indicating the communication system of the transmission signal is LTE very low band, for example, that is, the case where the mode information indicates a communication system that operates sufficiently at a lower output than GSM (registered trademark) or EDGE. In this case, the one power amplifier AMP3 is selected from among the three power amplifiers AMP2, AMP3 and AMP4 and connected to the duplexer 42 by the switch SW40 in accordance with an instruction from the control circuit 70. Thus, a transmission signal from the RFIC 20 is amplified by the power amplifier AMP3 in addition to the power amplifier AMP1, and is then guided to the duplexer 42. The transmission signal is guided to the antenna 60 from the duplexer 42 via the antenna switch 50, and is then transmitted from the antenna 60.

Next, a specific operation will be described for the case in which the mode information indicating the communication system of the transmission signal is LTE low band, for example, that is, the case where the mode information represents a communication system that operates sufficiently at a lower output than GSM (registered trademark) or EDGE. In this case, the one power amplifier AMP4 is selected from among the three power amplifiers AMP2, AMP3 and AMP4 and connected to the duplexer 43 by the switch SW40 in accordance with an instruction from the control circuit 70. Thus, a transmission signal from the RFIC 20 is amplified by the power amplifier AMP4 in addition to the power amplifier AMP1, and is then guided to the duplexer 43. The transmission signal is guided to the antenna 60 from the duplexer 43 via the antenna switch 50, and is then transmitted from the antenna 60.

Although a case has been exemplified in the above description in which the power amplification module 33 includes three power amplifiers AMP2, AMP3 and AMP4, the number of power amplifiers that can be connected in parallel with each other may be N. For example, in the case where the power amplification module 33 includes N power amplifiers that can be selectively connected in parallel with each other, it is sufficient that an i-th phase correction circuit be provided that can be selectively connected between the output of an i-th power amplifier and the output of an (i+1)-th power amplifier. Here, N is an integer of 3 or higher, and i is an integer in the range of 1 to N−1. In addition, in the case where the power amplification module 33 includes N power amplifiers that can be selectively connected in parallel with each other, the power amplification module 33 may include at least one switch (second switch) that selectively connects at least one phase correction circuit between the outputs of two or more selected power amplifiers. Furthermore, one power amplifier that will operate by itself or two or more power amplifiers that will operate in parallel with each other may be selected from among N power amplifiers in accordance with one communication system selected from among a plurality of communication systems and the transmission power. For example, the number of power amplifiers that are selected may be changed if the transmission power is different even if the communication system remains the same.

According to embodiment 3, one power amplifier that will operate by itself is selected from among three or more power amplifiers in accordance with one communication system selected from among a plurality of communication systems. Alternatively, two or more power amplifiers that will operate in parallel with each other are selected. Thus, a variety of communication systems having different transmission powers can be supported. In particular, since the power amplifiers are selected in accordance with the communication system and the transmission power, the optimum combination of power amplifiers can be selected in cases where the transmission power is different even if the communication system remains the same.

Figure 4:
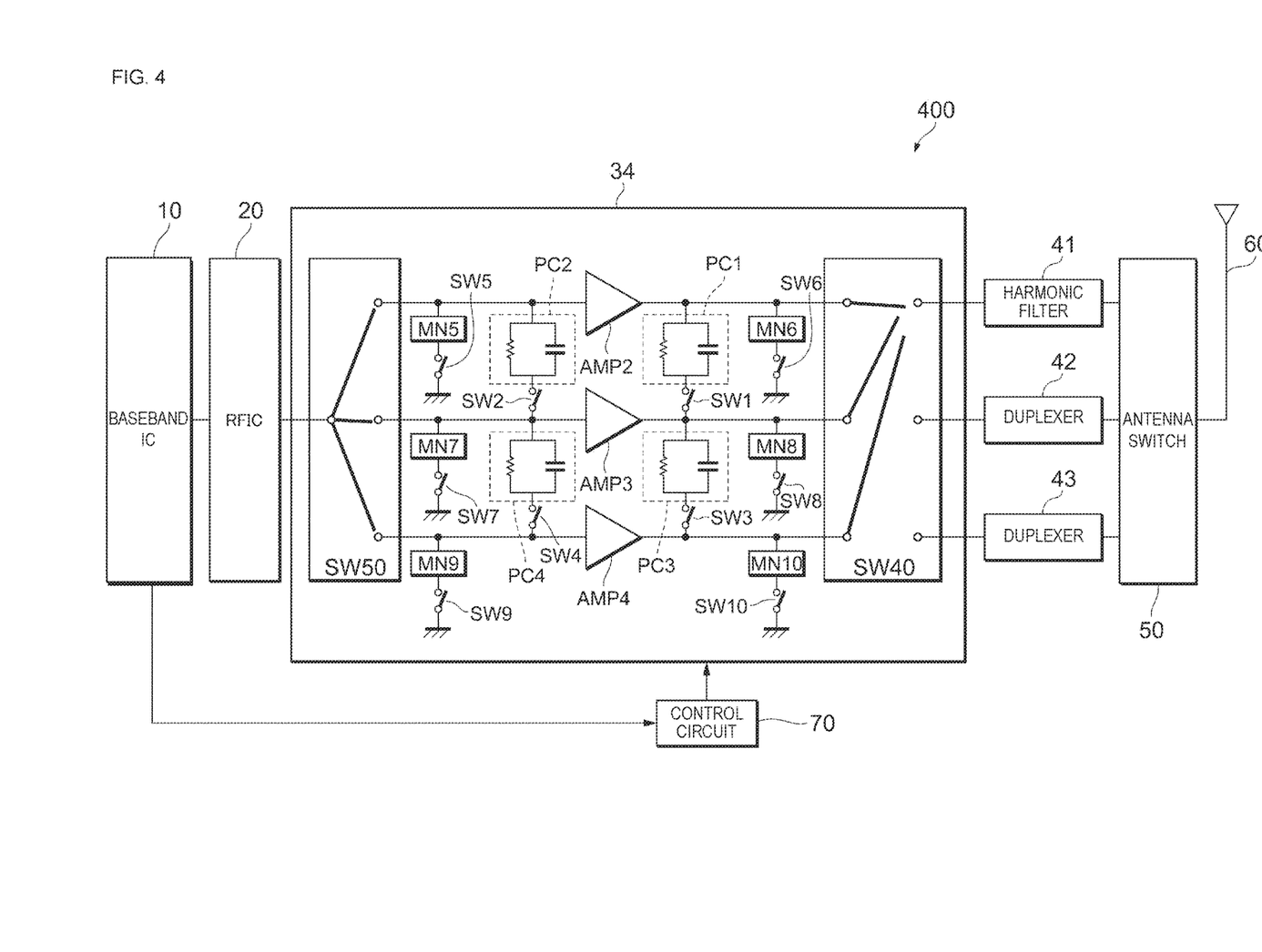
FIG. 4 is an explanatory diagram illustrating the fundamental circuit configuration of a communication module according to embodiment 4 of the present disclosure.

FIG. 4 is an explanatory diagram illustrating the fundamental circuit configuration of a communication module 400 according to embodiment 4 of the present disclosure. Symbols that are the same as those in FIG. 2 denote the same circuit elements as in FIG. 2, and therefore the description will focus on the differences between embodiments 2 and 4. A power amplification module 34 of embodiment 4 differs from the power amplification module 32 of embodiment 2 in that the power amplification module 34 includes a plurality of matching networks MN9 and MN10, and a power amplifier AMP4.

The communication module 400 includes a baseband IC 10, an RFIC 20, the power amplification module 34, a harmonic filter 41, duplexers 42 and 43, an antenna switch 50, an antenna 60, and a control circuit 70. The power amplification module 34 includes power amplifiers AMP2, AMP3 and AMP4, phase correction circuits PC1, PC2, PC3 and PC4, matching networks MN5, MN6, MN7, MN8, MN9 and MN10, a switch SW40 (first switch), a switch SW50 (first switch), a switch SW1 (second switch), a switch SW2 (fourth switch), a switch SW3 (second switch), a switch SW4 (fourth switch), a switch SW5 (third switch), a switch SW6 (third switch), a switch SW7 (third switch), a switch SW8 (third switch), a switch SW9 (third switch), and a switch SW10 (third switch).

The outputs of the two power amplifiers AMP3 and AMP4 can be selectively connected in parallel with each other via the phase correction circuit PC3 through an opening/closing operation of the switch SW3. The inputs of the two power amplifiers AMP3 and AMP4 can be selectively connected in parallel with each other via the phase correction circuit PC4 through an opening/closing operation of the switch SW4. The switch SW4 selectively connects the phase correction circuit PC4 between the inputs of the two selected power amplifiers AMP3 and AMP4. The phase correction circuits PC3 and PC4 each have a circuit configuration in which a resistor element and a capacitor element are connected in parallel with each other, for example.

The matching network MN9 performs input impedance matching for the power amplifier AMP4 by being selectively connected to the input of the power amplifier AMP4 through an opening/closing operation of the switch SW9. The matching network MN10 performs output impedance matching for the power amplifier AMP4 by being selectively connected to the output of the power amplifier AMP4 through an opening/closing operation of the switch SW10. The matching networks MN9 and MN10 are each formed of a capacitor element, an inductor element or a combination of capacitor elements and inductor elements.

Next, a specific operation will be described for the case where the mode information indicating the communication system of the transmission signal is GSM (registered trademark) or EDGE, for example, and in which the transmission output is equal to or higher than a prescribed threshold. In this case, all three power amplifiers AMP2, AMP3 and AMP4 are selected and connected to the harmonic filter 41 by the switches SW40 and SW50 in accordance with an instruction from the control circuit 70. In addition, the switches SW1, SW2, SW3, SW4, SW5, SW6, SW7, SW8, SW9 and SW10 are closed in accordance with an instruction from the control circuit 70. Thus, a transmission signal from the RFIC 20 is amplified by the three parallel-connected power amplifiers AMP2, AMP3 and AMP4, and is then guided to the harmonic filter 41. The transmission signal is guided to the antenna 60 from the harmonic filter 41 via the antenna switch 50, and is then transmitted from the antenna 60. At this time, even if a phase difference is generated between the output signals of the three power amplifiers AMP2, AMP3 and AMP4 due factors such as changes in temperature and variations in load, the phase difference is made to converge to zero by the phase correction circuits PC1, PC2, PC3 and PC4, and therefore, oscillations can be suppressed. In addition, input impedance matching and output impedance matching are performed for the power amplifiers AMP2, AMP3 and AMP4 by the plurality of matching networks MN5, MN6, MN7, MN8, MN9 and MN10, and therefore mismatching loss can be suppressed.

Next, a specific operation will be described for the case where the mode information indicating the communication system of the transmission signal is GSM (registered trademark) or EDGE, for example, and in which the transmission output is less than the prescribed threshold. In this case, the two power amplifiers AMP2 and AMP3 are selected from among the three power amplifiers AMP2, AMP3 and AMP4 and connected to the harmonic filter 41 by the switches SW40 and SW50 in accordance with an instruction from the control circuit 70. In addition, the switches SW1, SW2, SW5, SW6, SW7 and SW8 are closed and the switches SW3, SW4, SW9 and SW10 are opened in accordance with an instruction from the control circuit 70. Thus, a transmission signal from the RFIC 20 is amplified by the two parallel-connected power amplifiers AMP2 and AMP3, and is then guided to the harmonic filter 41. The transmission signal is guided to the antenna 60 from the harmonic filter 41 via the antenna switch 50, and is then transmitted from the antenna 60. At this time, even if a phase difference is generated between the output signals of the two power amplifiers AMP2 and AMP3 due factors such as changes in temperature and variations in load, the phase difference is made to converge to zero by the phase correction circuits PC1 and PC2, and therefore, oscillations can be suppressed. In addition, input impedance matching and output impedance matching are performed for the power amplifiers AMP2 and AMP3 by the plurality of matching networks MN5, MN6, MN7 and MN8, and therefore mismatching loss can be suppressed.

Next, a specific operation will be described for the case where the mode information indicating the communication system of the transmission signal is LTE very low band, for example. In this case, the one power amplifier AMP3 is selected from among the three power amplifiers AMP2, AMP3 and AMP4 and connected to the duplexer 42 by the switches SW40 and SW50 in accordance with an instruction from the control circuit 70. In addition, the switches SW7 and SW8 are closed, whereas the switches SW1, SW2, SW3, SW4, SW5, SW6, SW9 and SW10 are opened in accordance with an instruction from the control circuit 70. Thus, a transmission signal from the RFIC 20 is amplified by the power amplifier AMP3, and is then guided to the duplexer 42. The transmission signal is guided to the antenna 60 from the duplexer 42 via the antenna switch 50, and is then transmitted from the antenna 60. At this time, input impedance matching and output impedance matching are performed for the power amplifier AMP3 by the plurality of matching networks MN7 and MN8, and therefore mismatching loss can be suppressed.

Next, a specific operation will be described for the case where the mode information indicating the communication system of the transmission signal is LTE low band, for example. In this case, the one power amplifier AMP4 is selected from among the three power amplifiers AMP2, AMP3 and AMP4 and connected to the duplexer 43 by the switches SW40 and SW50 in accordance with an instruction from the control circuit 70. In addition, the switches SW9 and SW10 are closed, whereas the switches SW1, SW2, SW3, SW4, SW5, SW6, SW7 and SW8 are opened in accordance with an instruction from the control circuit 70. Thus, a transmission signal from the RFIC 20 is amplified by the power amplifier AMP4, and is then guided to the duplexer 43. The transmission signal is guided to the antenna 60 from the duplexer 43 via the antenna switch 50, and is then transmitted from the antenna 60. At this time, input impedance matching and output impedance matching are performed for the power amplifier AMP4 by the plurality of matching networks MN9 and MN10, and therefore mismatching loss can be suppressed.

Although a case has been exemplified in the above description in which the power amplification module 34 includes three power amplifiers AMP2, AMP3 and AMP4, the number of power amplifiers that can be connected in parallel may be N. In this case, it is sufficient to provide a plurality of matching networks that are selectively connected to the inputs and outputs of the N power amplifiers and perform input impedance matching and output impedance matching. N is an integer of 3 or higher.

As described above, the power amplification module 34 of embodiment 4 includes the switches SW5, SW7 and SW9 that respectively selectively connect the matching networks MN5, MN7 and MN9 to the inputs of the 1 or 2 or more selected power amplifiers AMP2, AMP3 and AMP4. Similarly, the power amplification module 34 includes the switches SW6, SW8 and SW10 that respectively selectively connect the matching networks MN6, MN8 and MN10 to the outputs of the 1 or 2 or more selected power amplifiers AMP2, AMP3 and AMP4. Thus, the combination of the open/closed states of the switches SW5, SW6, SW7, SW8, SW9 and SW10 can be selected (or changed) in accordance with the power amplifiers that are to be selected. Thus, input impedance matching and output impedance matching are selectively performed for the inputs and outputs of the 1 or 2 or more selected power amplifiers AMP2, AMP3 and AMP4, and therefore mismatching loss can be reduced.

The purpose of the embodiments described above is to enable easy understanding of the present invention and the embodiments are not to be interpreted as limiting the present invention. The present invention can be changed or improved without departing from the gist of the invention and equivalents to the present invention are also included in the scope of the present invention. In other words, appropriate design changes made to the embodiments by one skilled in the art are included in the scope of the present invention so long as the changes have the characteristics of the present invention. The elements included in the embodiments and the arrangements, materials, conditions, shapes, sizes and so forth of the elements are not limited to those exemplified in the embodiments and can be appropriately changed. For example, the meaning of "a circuit element A is connected to a circuit element B" is not limited to only the case where the circuit element A is directly connected to the circuit element B, and also includes the case where a signal path can be selectively established between the circuit element A and the circuit element B via a circuit element C (for example, a switch element). Furthermore, positional relationships in terms of directions such as above, below, left and right are not limited to the depicted proportions unless otherwise stated. In addition, the elements included in the embodiments can be combined as much as technically possible and such combined elements are also included in the scope of the present invention so long as the combined elements have the characteristics of the present invention. For example, the combination of opening/closing states of the switches may be freely selected or changed in accordance with the desired characteristics.

While embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A power amplification module that supports a plurality of communication systems, the power amplification module comprising:
   two power amplifiers;
   a first switch that, based on a communication system selected from among the plurality of communication systems, is configured to either selectively connect:
   one of the two power amplifiers to operate by itself, or
   the two power amplifiers in parallel with each other; and
   a phase correction circuit that, when the two power amplifiers are connected in parallel, is selectively connected between outputs of the two power amplifiers and is configured to remove a phase difference between output signals of the two power amplifiers.

2. The power amplification module according to claim 1, further comprising:
   a plurality of matching networks that are selectively connected to inputs and outputs of the power amplifiers and are configured to perform input impedance matching and output impedance matching.

3. The power amplification module according to claim 1, further comprising:
   a second switch that selectively connects the phase correction circuit between the outputs of the two selected power amplifiers.

4. The power amplification module according to claim 2, further comprising:
   a second switch that selectively connects the phase correction circuit between the outputs of the two selected power amplifiers.

5. The power amplification module according to claim 1, further comprising:
   a second phase correction circuit that, when the two power amplifiers are connected in parallel, is selectively connected between inputs of the two power amplifiers and is configured to remove a phase difference between input signals of the two power amplifiers.

6. The power amplification module according to claim 1, wherein the phase correction circuit comprises a resistor and a capacitor connected in parallel.

7. A power amplification module that supports a plurality of communication systems, the power amplification module comprising:
   at least three power amplifiers;
   a first switch that, based on a communication system selected from among the plurality of communication systems, is configured to either selectively connect:
   only one of the at least three power amplifiers to operate by itself, or
   at least two of the at least three power amplifiers in parallel with each other; and
   at least one output phase correction circuit that, when the at least two power amplifiers are connected in parallel, is selectively connected between outputs of two of the at least two power amplifiers and is configured to remove a phase difference between output signals of the two of the at least two power amplifiers.

8. The power amplification module according to claim 7, wherein the first switch selects the one power amplifier to operate by itself based on the selected communication system and a transmission power corresponding to the selected communication system.

9. The power amplification module according to claim 7, further comprising:
a plurality of matching networks that are selectively connected to inputs and outputs of the power amplifiers and are configured to perform input impedance matching and output impedance matching by being.

10. The power amplification module according to claim 7, further comprising:
one or more second switches that selectively connect the at least one output phase correction circuit between the outputs of the at least two power amplifiers.

11. The power amplification module according to claim 7, further comprising:
at least one input phase correction circuit that, when the at least two power amplifiers are connected in parallel, is selectively connected between inputs of two of the at least two power amplifiers and is configured to remove a phase difference between input signals of the two of the at least two power amplifiers.

12. The power amplification module according to claim 7, wherein the at least one output phase correction circuit comprises a resistor and a capacitor connected in parallel.

* * * * *